(12) United States Patent
Korikawa

(10) Patent No.: US 9,084,374 B2
(45) Date of Patent: Jul. 14, 2015

(54) ELECTRONIC DEVICE AND ELECTRONIC INSTRUMENT

(71) Applicant: FUJITSU LIMITED, Kawasaki, Kanagawa (JP)

(72) Inventor: Masayuki Korikawa, Yamato (JP)

(73) Assignee: FUJITSU LIMITED, Kawasaki (JP)

( * ) Notice: Subject to any disclaimer, the term of this patent is extended or adjusted under 35 U.S.C. 154(b) by 260 days.

(21) Appl. No.: 13/677,471

(22) Filed: Nov. 15, 2012

(65) Prior Publication Data
US 2013/0155612 A1    Jun. 20, 2013

(30) Foreign Application Priority Data

Dec. 20, 2011   (JP) ................................ 2011-278870

(51) Int. Cl.
*H05K 7/20* (2006.01)
(52) U.S. Cl.
CPC ........ *H05K 7/20536* (2013.01); *H05K 7/20145* (2013.01); *H05K 7/20618* (2013.01)
(58) Field of Classification Search
USPC ........................ 361/676–678, 679.46–679.54, 361/688–722, 752, 760, 831
See application file for complete search history.

(56) References Cited

U.S. PATENT DOCUMENTS

| | | | | |
|---|---|---|---|---|
| 7,554,803 B2* | 6/2009 | Artman et al. | ................. | 361/695 |
| 8,300,409 B2* | 10/2012 | Wei et al. | ..................... | 361/690 |
| 8,767,399 B2* | 7/2014 | Goto et al. | ..................... | 361/695 |
| 2007/0171609 A1* | 7/2007 | Kehl et al. | ..................... | 361/690 |
| 2009/0034190 A1* | 2/2009 | Tsai et al. | ..................... | 361/695 |
| 2010/0020487 A1* | 1/2010 | Lee et al. | ................. | 361/679.49 |
| 2010/0097758 A1* | 4/2010 | Franz et al. | ..................... | 361/694 |
| 2010/0105313 A1* | 4/2010 | Tsai et al. | ..................... | 454/284 |
| 2010/0165568 A1* | 7/2010 | Tsai et al. | ................. | 361/679.49 |
| 2013/0163191 A1* | 6/2013 | Chen et al. | ............... | 361/679.46 |

FOREIGN PATENT DOCUMENTS

| | | |
|---|---|---|
| JP | 05-041588 | 2/1993 |
| JP | 5-21485 | 3/1993 |
| JP | 5-21492 | 3/1993 |
| JP | 06-334373 | 12/1994 |
| JP | 2009-170649 | 7/2009 |

OTHER PUBLICATIONS

Korean Office Action dated Feb. 11, 2014 in Korean Patent Application No. 10-2012-139537.
Chinese Office Action dated Jan. 13, 2015 in Chinese Patent Application No. 201210511122.8.

* cited by examiner

*Primary Examiner* — Courtney Smith
(74) *Attorney, Agent, or Firm* — Staas & Halsey LLP

(57) ABSTRACT

An electronic device includes: a plurality of slots where a plurality of electronic instruments are mountable; and an electronic instrument inserted in any of the plurality of slots; wherein the electronic instrument includes a flow rate limiting member that protrudes to a side of an adjacent slot where no electronic instrument is mounted and limits a flow rate of cooling air flowing through the adjacent slot.

18 Claims, 14 Drawing Sheets

ELECTRONIC DEVICE AND ELECTRONIC INSTRUMENT

CROSS-REFERENCE TO RELATED APPLICATION(S)

This application is based upon and claims the benefit of priority of the prior Japanese Patent Application No. 2011-278870, filed on Dec. 20, 2011, the entire contents of which are incorporated herein by reference.

FIELD

The embodiments discussed herein are related to an electronic device and its electronic instrument.

BACKGROUND

In related art, there is an electronic device in which a plurality of electronic instruments or shelf-mount electronic units (hereinafter referred to as mount units) having the same height and width are placed in a storage-dedicated rack (which may be called a shelf and hereinafter referred to as a case). In this electronic device, the mount units are used as being horizontally placed in a longitudinal direction of the case or being longitudinally placed in a horizontal direction.

In an air-cooled electronic device, to keep a normal cool state of each mount unit, cooling air is suitably supplied to each mount unit with balance. However, when a mount unit is extracted from the electronic device for repair or replacement, a large amount of cooling air flows into a space from which the mount unit has been extracted (which is a space to accommodate a mount unit and is called a slot), and the cooling balance among the remaining mount units is destroyed.

For this reason, when a mount unit is extracted from the electronic device, some measures are taken such as increasing the number of revolutions of a cooling fan or mounting a shielding plate on the case for closing the opening of a slot after a mount unit is extracted from the case.

[Patent document] Japanese Unexamined Utility Model Registration Application Publication No. 5-21492

However, if the number of revolutions of the cooling fan is increased to enhance supply capability of cooling air to increase the volume of air when an out-of-order mount unit is extracted from the electronic device, noise and electric power are increased. Moreover, the cooling fan is expected to have blowing capability appropriate to a maximum volume of air, and therefore is disadvantageously large in size and high in price with the use of a high-performance motor capable of high speed revolutions.

Furthermore, when a shielding plate is mounted on the case, the case itself has a mount structure for mounting the shielding plate, and therefore a limitation on the structure of the case tend to occur.

SUMMARY

According to an aspect of the invention, an electronic device includes: a plurality of slots where a plurality of electronic instruments are mountable; and an electronic instrument inserted in any of the plurality of slots; wherein the electronic instrument includes a flow rate limiting member that protrudes to a side of an adjacent slot where no electronic instrument is mounted and limits a flow rate of cooling air flowing through the adjacent slot.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1A:
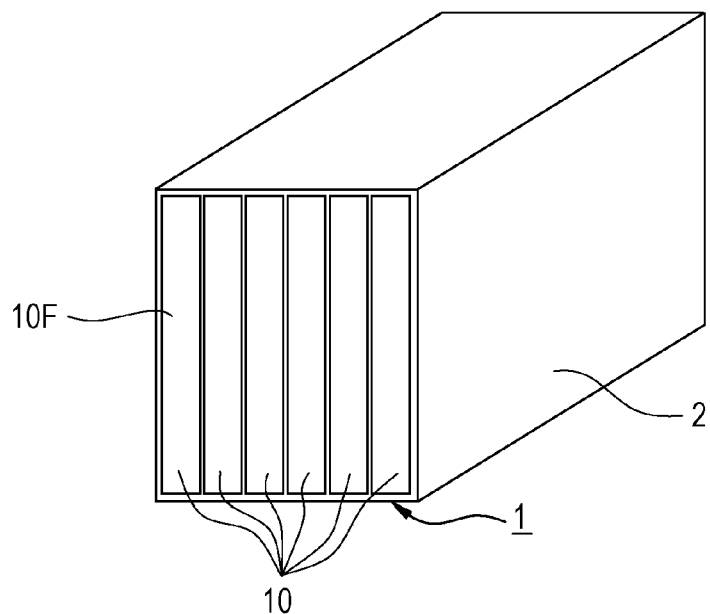
FIG. 1A is a perspective view of an electronic device where mount units of an embodiment are mounted.

The embodiments are described in detail below using the attached drawing based on specific examples. Note that identical component members are provided with a same reference character for description. Also, while a mount unit is described in the embodiments as an electronic instrument that is accommodated in a slot in a case of an electronic device, examples of the electronic instrument may include a printed board and a hard disk device, in addition to the mount unit accommodated in the case.

Furthermore, while the number of mount units is small for convenience of description in the embodiments, the number of mount units accommodated in the case is not particularly restricted.

Figure 1B:
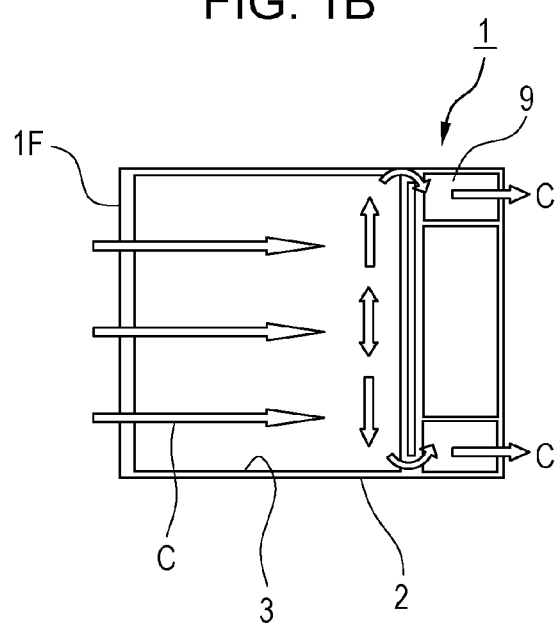
FIG. 1B is a side sectional view of the electronic device depicted in FIG. 1A.
Figure 1C:
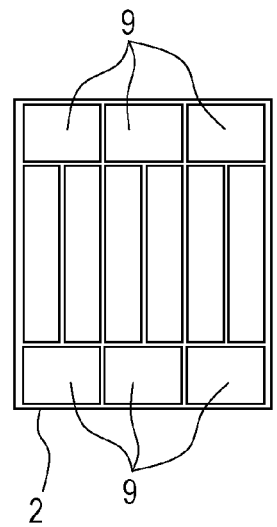
FIG. 1C is a rear view of the electronic device depicted in FIG. 1A viewed from a rear side.

FIG. 1A is a perspective view of an example of an electronic device 1 where mount units 10, which are electronic instruments of an embodiment, are mounted. FIG. 1B is a side sectional view of the electronic device 1 depicted in FIG. 1A. FIG. 1C is a rear view of the electronic device 1 depicted in FIG. 1A viewed from a rear side. In the electronic device 1 of this example, six mount units 10 are mounted inside a case 2, and six mount units 10 take cooling air C in from a front surface 10F and blow the air by cooling fans 9 on a rear side. In a space between the cooling fans 9, a printed board, a power supply unit, and others are mounted, although not depicted.

Figure 2A:
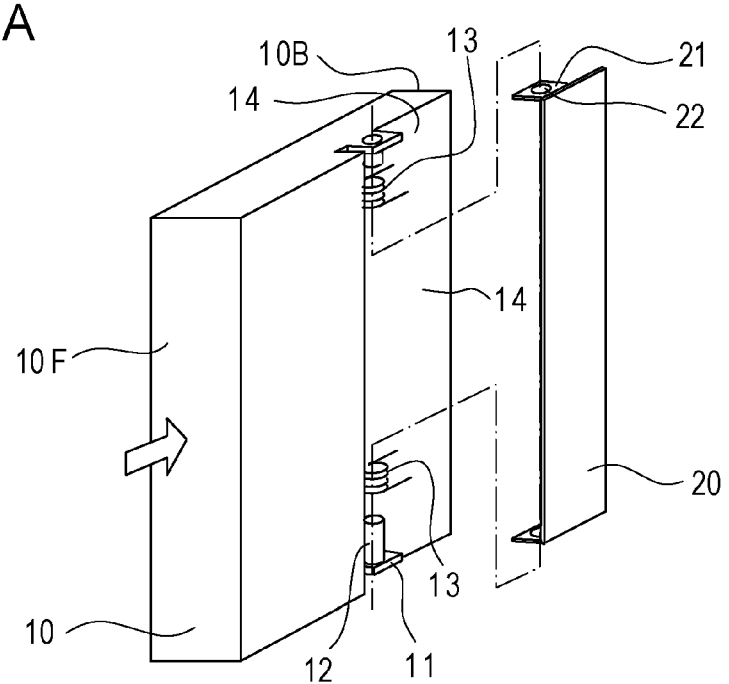
FIG. 2A is a perspective view of a mount unit of a first embodiment for assembly.
Figure 2B:
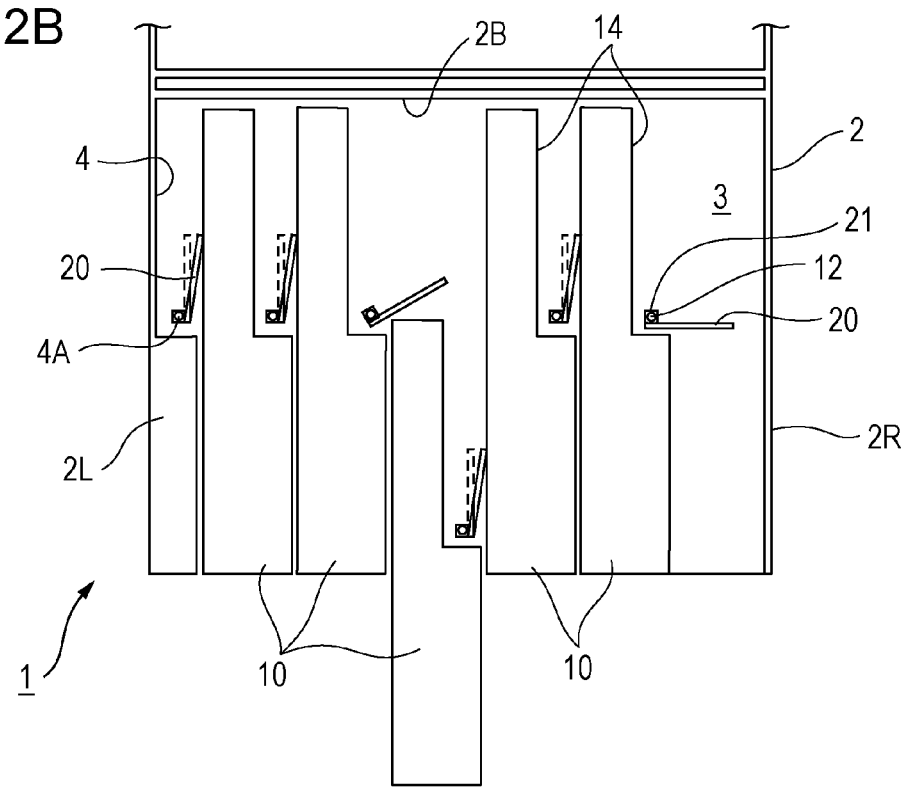
FIG. 2B is a horizontal sectional view of an electronic device where six mount units of the first embodiment are mounted.

FIG. 2A is a perspective view of the mount unit 10 of a first embodiment to be mounted on the electronic device 1 depicted in FIG. 1A for assembly. FIG. 2B is a horizontal sectional view of the electronic device 1 where six mount units 10 of the first embodiment are mountable. In the first embodiment, a recessed part 14 is formed on one side surface of the mount unit 10 on a rear end face 10B side. In this recessed part 14, a shielding plate 20 is provided. On both sides of the shielding plate 20 on the front surface 10F of the mount unit 10, brackets 21 are provided, each including a shaft insertion hole 22.

On the other hand, on both sides of the recessed part 14 on the front surface 10F of the mount unit 10, brackets 11 are provided, each having a rotational shaft 12 protruding therefrom. After springs 13 are mounted, the rotational shafts 12 are loosely inserted into the shaft insertion holes 22 provided in the brackets 21 of the shielding plate 20. The shielding plate 20 is pressed by the springs 13 in a direction in which its tip part protrudes from the recessed part 14.

In the shielding plate 20, an opening is provided so that a ventilation resistance is similar to that of the mount unit 10, or the size of the shielding plate 20 is adjusted. In FIG. 2A and FIG. 2B, the shielding plate 20 is placed in the recessed part 14 and is positioned approximately in the middle of the mount unit 10. However, the shielding plate 20 may be positioned anywhere as long as it is in a cooling air path. That is, the shielding plate 20 may be mounted at a most appropriate position according to the cooling structure of the entire electronic device 1 and the structure of the ventilation path defined by arrangement of components in the mount unit 10.

The shielding plate 20 is given a force of rotation in a direction of opening anytime by the springs 13. As depicted in FIG. 2B, when the mount unit 10 is mounted adjacently, the shielding plate 20 is in a rotated state where the tip part abuts on the adjacent mount unit 10.

FIG. 2B depicts the state in which the rightmost mount unit 10 has already been extracted from among six mount units 10 and the mount unit 10 third from the left is being extracted. In the state in which the mount unit 10 has been completely extracted from a mount space (hereinafter referred to as a slot) 3 of the case 2, the shielding plate 20 automatically opens with the force of the springs 13, and protrudes into the slot 3 from which the mount unit 10 has been extracted. With this protrusion of the shielding plate 20 into the slot 3, the flow rate of the cooling air flowing through the slot 3 may be limited. Therefore, if the area of the shielding plate 20 and the area of the opening at the time of protrusion into the slot 3 are defined in advance, the flow rate of the cooling air flowing through the slot 3 may be equalized with the flow rate when the mount unit 10 is inserted into this slot 3.

Figure 3:
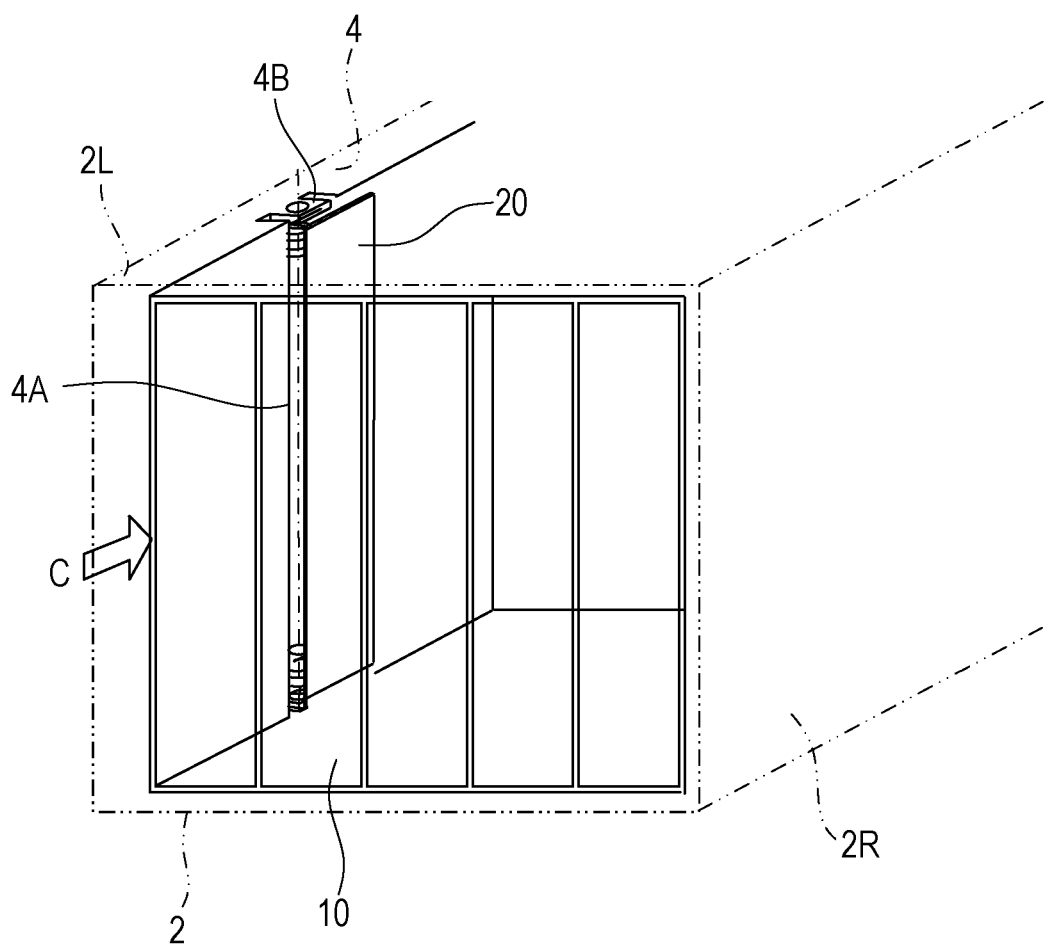
FIG. 3 is a partially enlarged perspective view of the structure of a left side wall of the electronic device for mounting mount units of the first embodiment.

While the shielding plate 20 is mounted on the right surface of the mount unit 10 in the first embodiment, the shielding plate 20 may be mounted on the left surface. Also, when the shielding plate 20 is mounted on one side surface (the right surface) of the mount unit 10, if the leftmost mount unit 10 in the case 2 is extracted, nothing fills the slot 3 after extraction. In this case, as depicted in FIG. 2B, a left side wall 2L of the case 2 may be thickened so as to be partially provided with the recessed part 14 and, as depicted in FIG. 3, a rotational shaft 4A and a bracket 4B may be provided in this recessed part 14 so as to provide a shielding plate 20 having a structure similar to that of the shielding plate 20 provided on the mount unit 10. When the shielding plate 20 is mounted on the left surface of the mount unit 10, a shielding plate 20 having a similar structure may be provided on a right side wall 2R of the case 2.

Figure 4A:
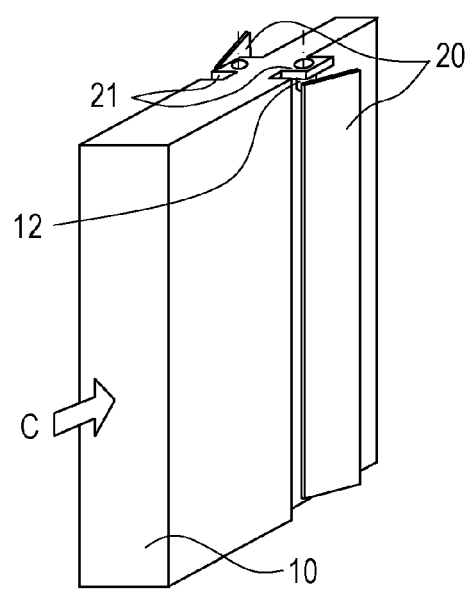
FIG. 4A is a perspective view of a mount unit of a second embodiment.
Figure 4B:
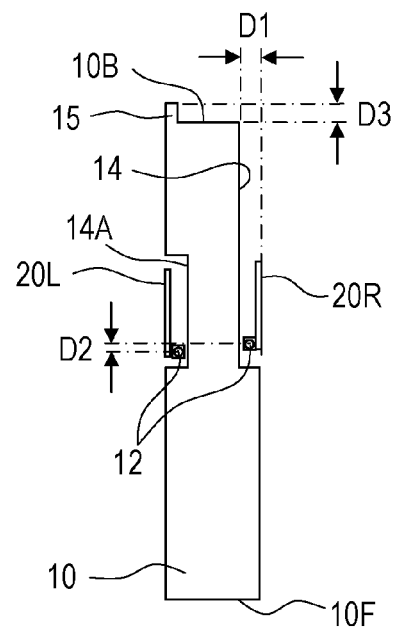
FIG. 4B is a plan view of the mount unit of the second embodiment.

FIG. 4A is a perspective view of the mount unit 10 of a second embodiment. FIG. 4B is a plan view of the mount unit 10 of the second embodiment. In the second embodiment, the shielding plates 20 are provided on both side surfaces of the mount unit 10. Here, of these shielding plates 20, the one placed on the left side surface of the mount unit 10 is referred to as a shielding plate 20L, and the one placed on the right side surface of the mount unit 10 is referred to as a shielding plate 20R.

Figure 5A:
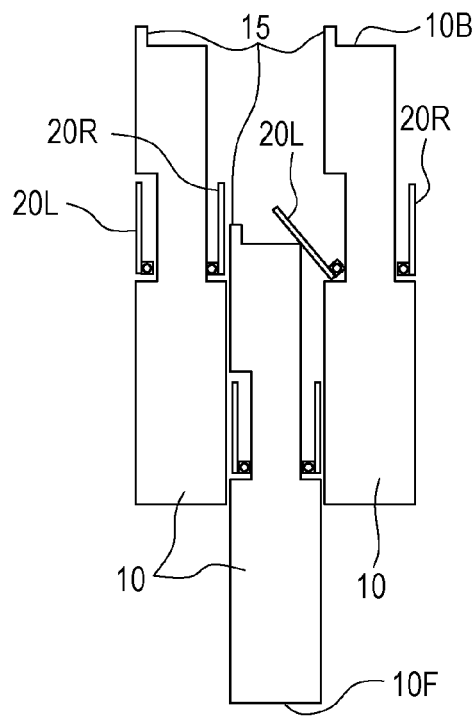
FIG. 5A is a plan view corresponding to FIG. 4C depicting the operation of the shielding plate when the shielding plate of the second embodiment is placed at an inappropriate position.
Figure 5B:
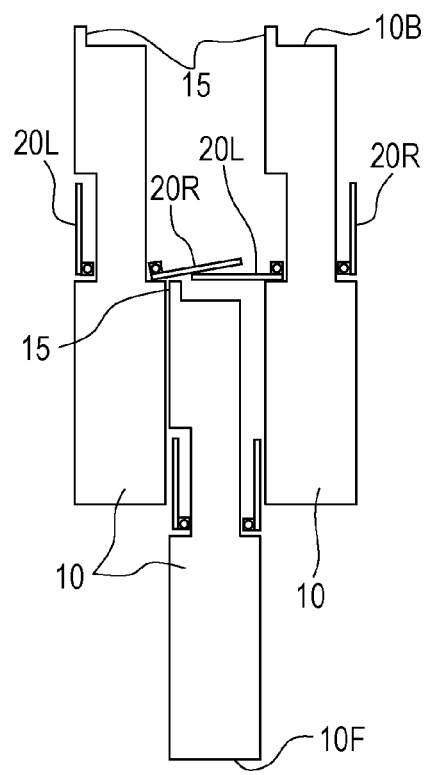
FIG. 5B is a plan view corresponding to FIG. 4D depicting the operation of the shielding plate when the shielding plate of the second embodiment is placed at an inappropriate position.
Figure 5C:
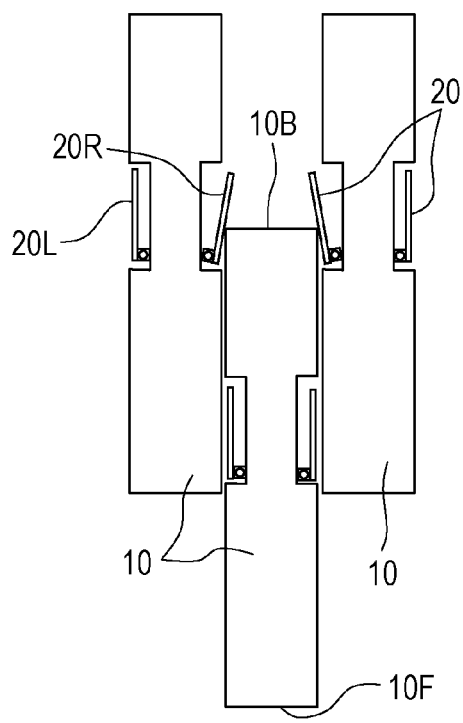
FIG. 5C is a plan view of another example when the shielding plate is placed at an inappropriate position.
Figure 5D:
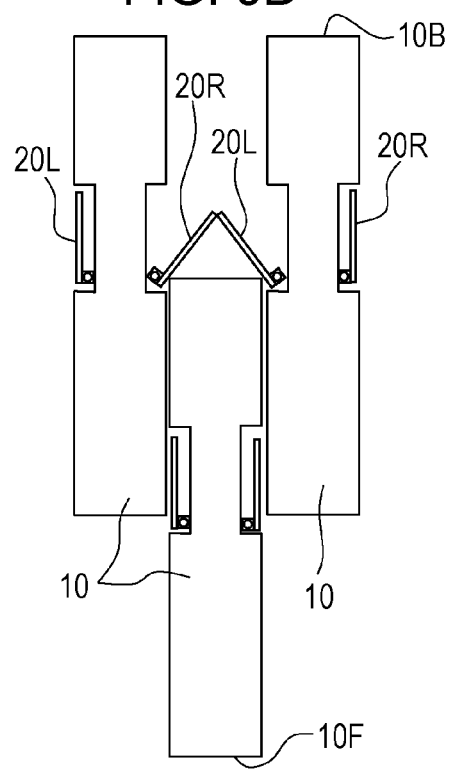
FIG. 5D is a plan view of still another example when the shielding plate is placed at an inappropriate position.

When the shielding plates 20L and 20R are provided on both side surfaces of the mount unit 10, if the shielding plates 20L and 20R are mounted at the center of the mount unit 10 so as to be equally away from the front surface 10F as depicted in FIG. 5C and FIG. 5D, opening and closing timings are the same between the shielding plates 20L and 20R. If the opening and closing timings are the same between shielding plates 20L and 20R, the shielding plates 20L and 20R collide with each other when the mount unit 10 is inserted and extracted. This does not pose a problem in view of a cooling function, but the occurrence of chips and collision sound due to rubbing of the shielding plates 20L and 20R at the time of collision are not preferable.

Thus, in the second embodiment, as depicted in FIG. 4B, to shift the opening and closing timings between the shielding plates 20L and 20R, a positional difference D2 is provided between the mounting positions of the rotational shafts 12 of the shielding plates 20L and 20R. The right shielding plate 20R is provided in the recessed part 14 having a depth D1, as with the first embodiment. As for the left shielding plate 20L, a second recessed part 14A having the same depth as that of the recessed part 14 is provided on a left side surface of the mount unit 10, and the rotational shafts 12 of the shielding plate 20L are moved to a front surface 10F side of the mount unit 10 by the distance (positional difference) D2 with respect to the rotational shafts 12 of the shielding plate 20R.

Figure 4C:
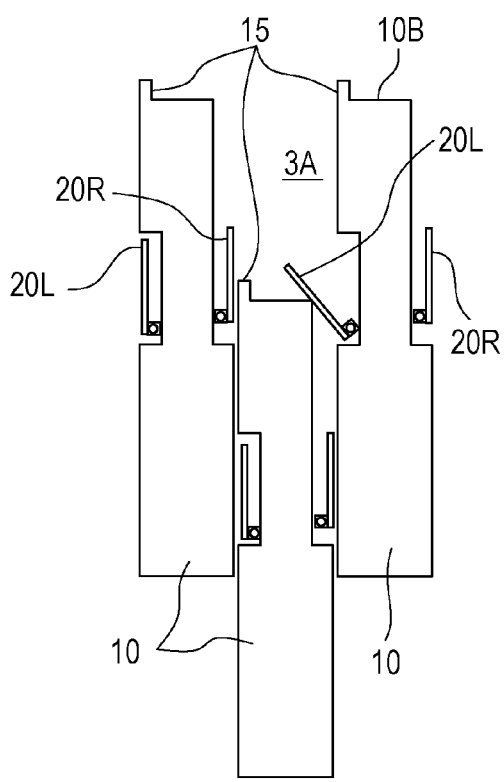
FIG. 4C is a plan view depicting the operation of shielding plates when the mount unit depicted in FIG. 4B is extracted from an electronic device.

Furthermore, a projection 15 having a height D3 is provided on a rear end face 10B of the mount unit 10 on a side where the shielding plate 20L is provided. The height D3 of the projection 15 is higher than the positional difference D2 of the rotational shafts 12 of the shielding plates 20L and 20R. FIG. 4C depicts the operation of the shielding plates 20L and 20R when the mount unit 10 depicted in FIG. 4B is extracted from the electronic device 1. When the mount unit 10 is extracted, the shielding plate 20L rotates in an opening direction at earlier timing to protrude into a slot 3A, but the shielding plate 20R is unable to rotate because it is interrupted by the projection 15.

Figure 4D:
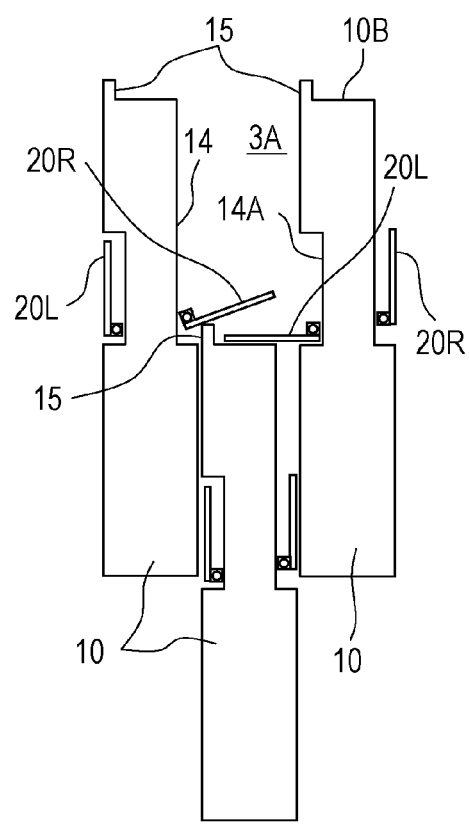
FIG. 4D is a plan view depicting the operation of the shielding plate when the mount unit is further extracted from the state depicted in FIG. 4C.

When the mount unit 10 is further extracted as depicted in FIG. 4D, the restriction on the shielding plate 20R by the projection 15 is removed, and therefore the shielding plate 20R rotates in an opening direction at later timing to protrude into the slot 3A. As such, the shielding plates 20L and 20R protrude into the slot 3A at different timings, and therefore interference between the shielding plates 20L and 20R may be avoided. Conversely, when the repaired mount unit 10 is inserted into the slot 3A, as depicted in FIG. 4D, the shielding plate 20R first starts closing by the projection 15 at earlier timing. Then, at later timing with the shielding plate 20R being closed to some extent, the shielding plate 20L is pressed by the rear end face 10B of the mount unit 10 to be closed. Therefore, interference between the shielding plates 20L and 20R may be avoided even at the time of insertion of the mount unit 10.

On the other hand, if no positional difference D2 is provided and the projection 15 having the height D3 is formed on the rear end face 10B of the mount unit 10 on the side where the shielding plate 20L is provided, the opening and closing timings of the shielding plates 20L and 20R differ from each other as depicted in FIG. 5A. However, when the mount unit 10 is extracted, the shielding plates 20L and 20R collide with each other as depicted in FIG. 5B, which is not preferable as with the case depicted in FIG. 5C and FIG. 5D.

Figure 6A:
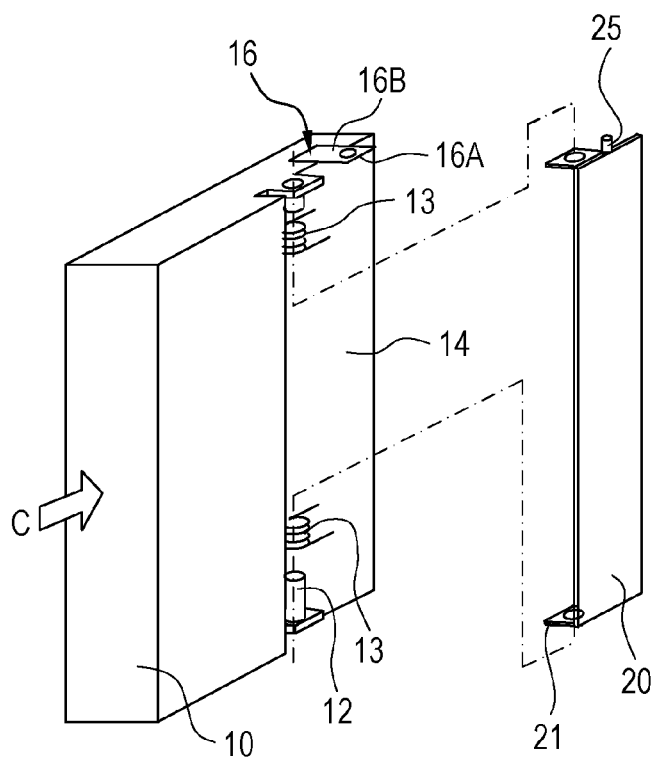
FIG. 6A is a perspective view of a mount unit of a third embodiment for assembly.

FIG. 6A is a perspective view of the mount unit 10 of a third embodiment for assembly, which is a modification example of the first embodiment. In the first embodiment, the shielding plate 20 is pressed by the springs 13 in an opening direction. Therefore, with the mount unit 10 being extracted from the case 2 of the electronic device 1, the shielding plate 20 is in an open state anytime, protruding from the recessed part 14. When a slot successive to the slots 3 of the electronic device 1 is not present, with the shielding plate 20 being in an open state, the mount unit 10 is unable to be inserted in a single vacant slot of the electronic device 1, and the mount unit 10 has to be inserted with the shielding plate 20 being closed by hand. If a user forgets to close the shielding plate 20 and tries to insert the mount unit 10 into the slot 3 of the electronic device 1, there is a possibility of damaging the shielding plate 20.

Figure 6B:
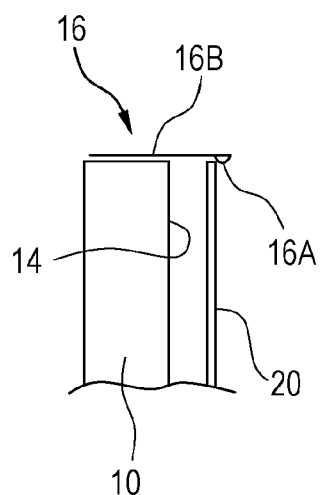
FIG. 6B is a partial view depicting a function of a shielding plate engaging tool depicted in FIG. 6A.
Figure 6C:
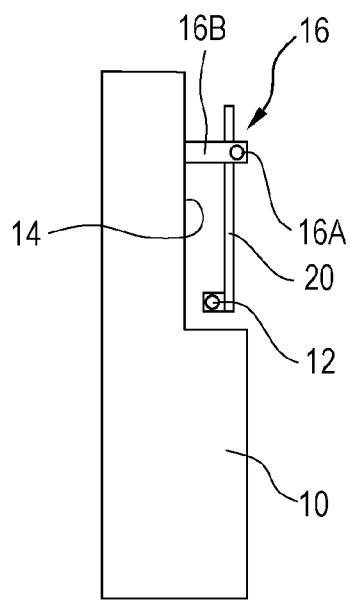
FIG. 6C is a plan view of a mount unit of a third embodiment.

The mount unit 10 of the third embodiment is configured to be easily inserted into a slot, and a lock plate 16 for engaging the shielding plate 20 in the recessed part 14 is provided at a peripheral part of the recessed part 14. As depicted in FIG. 6B, the lock plate 16 includes a spring 16B having one end fixed to a side surface of the mount unit 10 and a projection 16A provided at a tip of the spring 16B so as to protrude therefrom. The projection 16A of the lock plate 16 protrudes into the recessed part 14 and, when the shielding plate 20 is pressed into the recessed part 14, the spring 16B is deformed to cause the projection 16A to climb over the shielding plate 20 to be positioned outside the shielding plate 20. As a result, as depicted in FIG. 6C, when the shielding plate 20 is pressed to go over the projection 16A and into the recessed part 14, the projection 16A stops rotation of the shielding plate 20 outwardly from the recessed part 14.

Figure 6D:
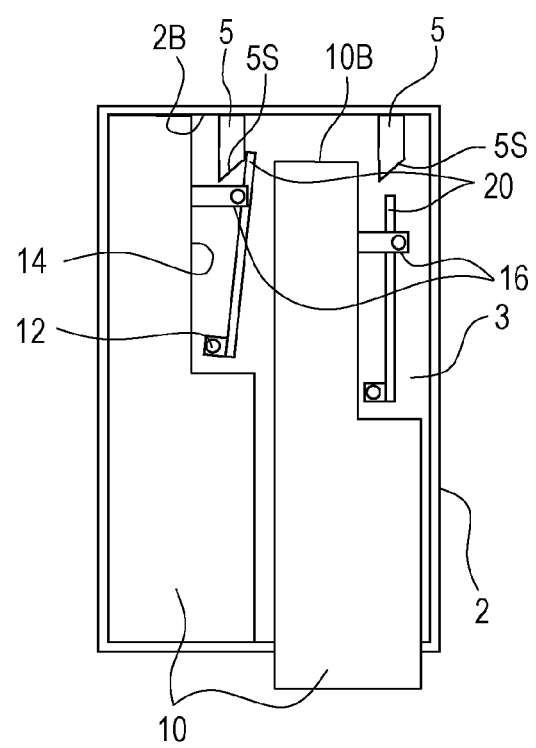
FIG. 6D is a plan view of a case of an embodiment for accommodating the mount unit of the third embodiment.

As such, in the mount unit 10 of the third embodiment, with the lock plate 16, the shielding plate 20 may be mounted inside the electronic device 1 as being closed. However, after being mounted inside the electronic device 1, the shielding plate 20 is desirably released from engagement by the lock plate 16 and has its tip protruding by the spring 13 from the recessed part 14 to the outside. For this reason, when the mount unit 10 of the third embodiment is mounted on the electronic device 1, an unlock projection 5 for releasing the engagement of the lock plate 16 is provided on a wall surface 2B positioned at the deepest part of the slot 3 of the case 2 of the electronic device 1, as depicted in FIG. 6D.

The unlock projection 5 is provided with a slope 5S at a position facing the tip of the shielding plate 20. This slope 5S is tilted in a direction in which the tip of the shielding plate 20 is moved to the outside of the recessed part 14. When the mount unit 10 is inserted into the slot 3, with the rear end face 10B of the mount unit 10 being close to the wall surface 2B, the tip of the shielding plate 20 climbs over this slope 5S and is moved to the outside of the recessed part 14. With the movement of the shielding plate 20, the engagement by the lock plate 16 is released immediately before mounting of the mount unit 10 is complete. With the engagement by the lock plate 16 being released, the shielding plate 20 becomes rotatable, and opens up to a position where the tip of the shielding plate 20 abuts on the side surface of the adjacent mount unit 10. As a result, when the adjacent mount unit 10 is extracted from the electronic device 1, the shielding plate 20 automatically opens, and a vacant slot after extraction of the mount unit 10 may be closed.

Figure 7A:
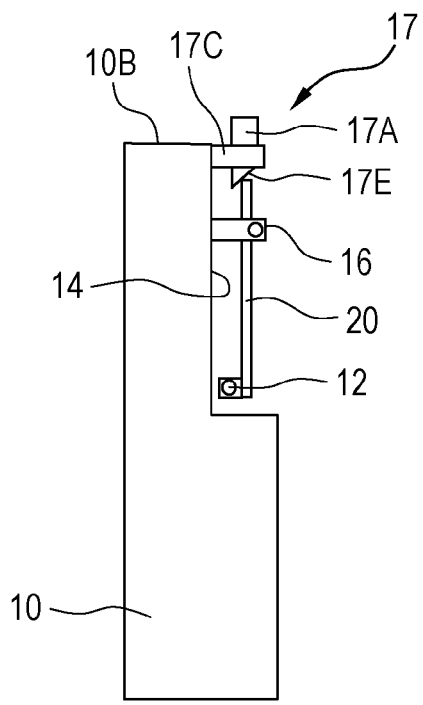
FIG. 7A is a plan view of a mount unit of a fourth embodiment.

FIG. 7A depicts the mount unit 10 of a fourth embodiment. In the mount unit 10 of the third embodiment, the engagement of the shielding plate 20 by the lock plate 16 is released by the unlock projection 5 provided to the wall surface 2B positioned at the deepest part of the slot 3. On the other hand, in the fourth embodiment, an unlock mechanism 17 corresponding to the unlock projection 5 of the third embodiment is provided in the recessed part 14 of the mount unit 10.

Figure 7B:
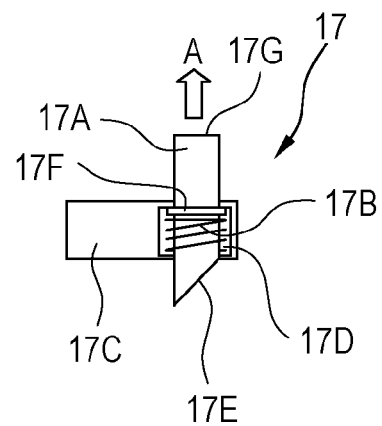
FIG. 7B is a partially enlarged view of an unlock mechanism depicted in FIG. 7A.

As depicted in FIG. 7B, the unlock mechanism 17 includes a support 17C provided to protrude into the recessed part 14, a spring accommodating part 17D provided at a tip of the support 17C for accommodating a spring 17B, and a slide member 17A having the spring 17B in the spring accommodating part 17D inserted therearound. An end face 17G orthogonal to a sliding direction of the slide member 17A is provided at one end of the slide member 17A, and a slope 17E is provided at the other end. With the unlock mechanism 17 mounted on the recessed part 14, the slope 17E is engaged by the lock plate 16 to face the tip of the shielding plate 20 positioned in the recessed part 14. The slide member 17A in the spring accommodating part 17D is provided with a flange part 17F, which is pressed by the spring 17B, and therefore the slide member 17A is pressed in a direction indicated by an arrow A. As depicted in FIG. 17A, the support 17C is mounted at the deepest part of the recessed part 14. In this state, the end face 17G of the slide member 17A protrudes from the rear end face 10B of the mount unit 10 to the outside.

Figure 7C:
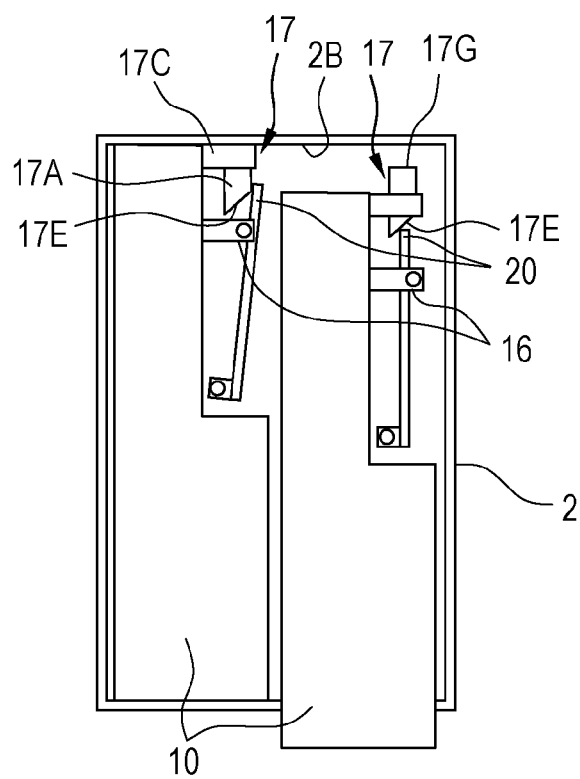
FIG. 7C is a plan view depicting the operation of the unlock mechanism when the mount unit of the fourth embodiment is inserted into a case.

FIG. 7C is a plan view depicting the operation of the unlock mechanism 17 when mount units 10 of a fourth embodiment are inserted into the case 2. With the shielding plate 20 being engaged with the lock plate 16, the mount unit 10 is inserted into the case 2. Then, before the rear end face 10B of the mount unit 10 reaches the wall surface 2B positioned at the deepest part of the slot 3, the end face 17G of the slide member 17A of the unlock mechanism 17 abuts on this wall surface 2B. When the mount unit 10 is further inserted into the case 2, the slide member 17A is moved against the spring 17B, and the end of the shielding plate 20 climbs over the slope 17E to cause the shielding plate 20 to rotate from the recessed part 14 to the outside, thereby releasing the engagement of the shielding plate 20 by the lock plate 16.

With the engagement by the lock plate 16 being released, the shielding plate 20 becomes rotatable, and the shielding plate 20 opens up to a position where the tip of the shielding plate 20 abuts on the side surface of the adjacent mount unit 10. As a result, when the adjacent mount unit 10 is extracted from the electronic device 1, the shielding plate 20 automatically opens, and a vacant slot after extraction of the mount unit 10 may be closed.

Figure 8A:
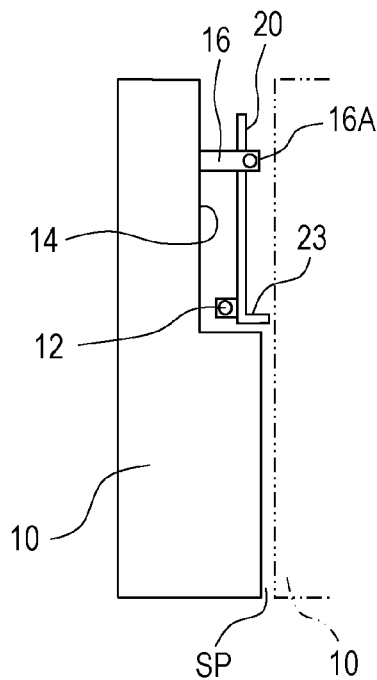
FIG. 8A is a plan view of a mount unit of a fifth embodiment.

FIG. 8A is a plan view of the mount unit 10 of a fifth embodiment. The mount unit 10 of the fifth embodiment is also provided at a peripheral part of the recessed part 14 with the lock plate 16 for engaging the shielding plate 20 in the recessed part 14. The structure of the lock plate 16 is identical to those of the third and fourth embodiments. When the shielding plate 20 is pressed to go over the projection 16A and into the recessed part 14A, the projection 16A stops rotation of the shielding plate 20 from the recessed part 14 to the outside. The mount unit 10 of the fifth embodiment is different from the mount unit 10 of the third embodiment depicted in FIG. 6C in that a lever 23 protruding into a space SP between the mount unit 10 and the adjacent mount unit 10 accommodated in the slot 3 is formed at an end of the shielding plate 20 on a rotational shaft 12 side.

Figure 8B:
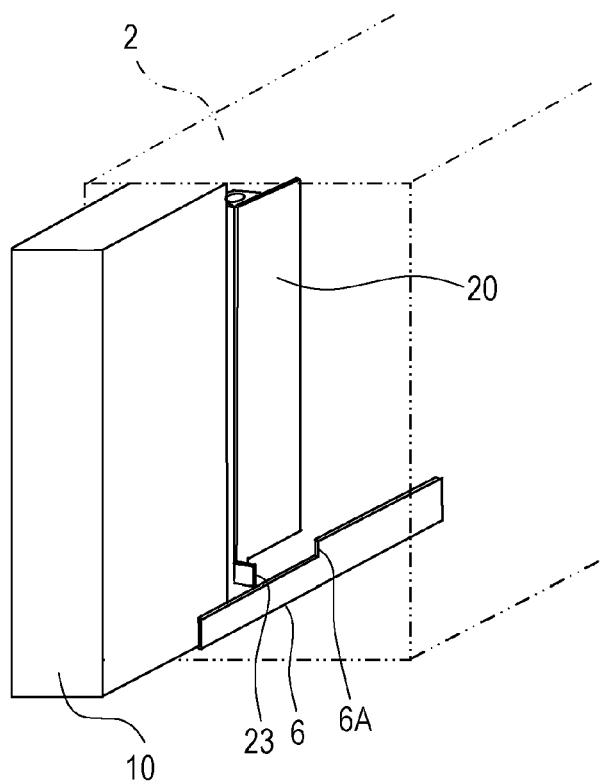
FIG. 8B is a partial perspective view of the structure of a case for accommodating the mount unit of the fifth embodiment.

On the other hand, as depicted in FIG. 8B, in the case 2 of the electronic device 1 corresponding to the mount unit 10 of the fifth embodiment, a guide plate 6 is provided in the space SP. A step part 6A is provided to a middle portion of the guide plate 6 in a direction of insertion of the mount unit 10. The height of the guide plate 6 on a side deeper than the step part 6A is taller than the height on an entrance side. This step part 6A is at a position of abutting on the lever 23 when the mount unit 10 of the fifth embodiment is in the course of being inserted into the slot 3 in the case 2.

Figure 8C:
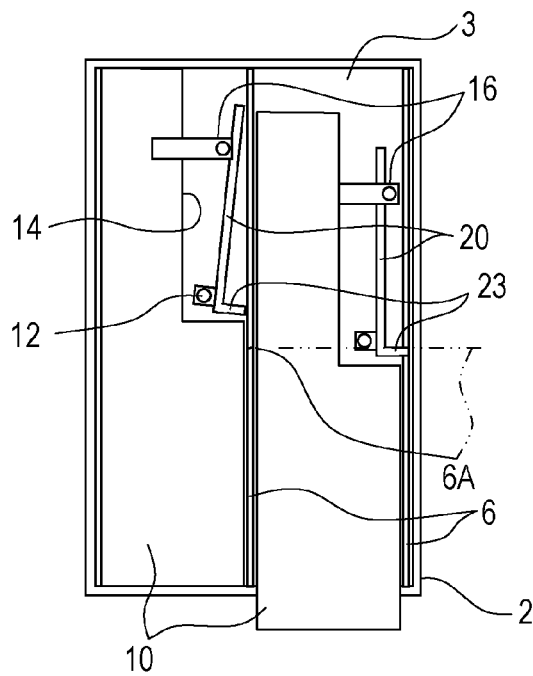
FIG. 8C is a plan view depicting the operation of an unlock mechanism when mount units of the fifth embodiment are inserted into the case.

As depicted in FIG. 8C, when the mount unit 10 of the fifth embodiment is inserted into the slot 3 of the case 2, the step part 6A abuts on the lever 23 midway through insertion. The position of the step part 6A is indicated by a two-dot chain line. When insertion of the mount unit 10 into the slot 3 continues even after the step part 6A abuts on the lever 23, the lever 23 is pressed by the step part 6A to cause the shielding plate 20 to rotate in an opening direction. When the shielding plate 20 rotates, engagement of the shielding plate 20 by the lock plate 16 is released.

With the engagement by the lock plate 16 being released, the shielding plate 20 becomes rotatable, and opens up to a position where the tip of the shielding plate 20 abuts on the side surface of the adjacent mount unit 10. As a result, when the adjacent mount unit 10 is extracted from the electronic device 1, the shielding plate 20 automatically opens, and a vacant slot after extraction of the mount unit 10 may be closed.

Figure 9A:
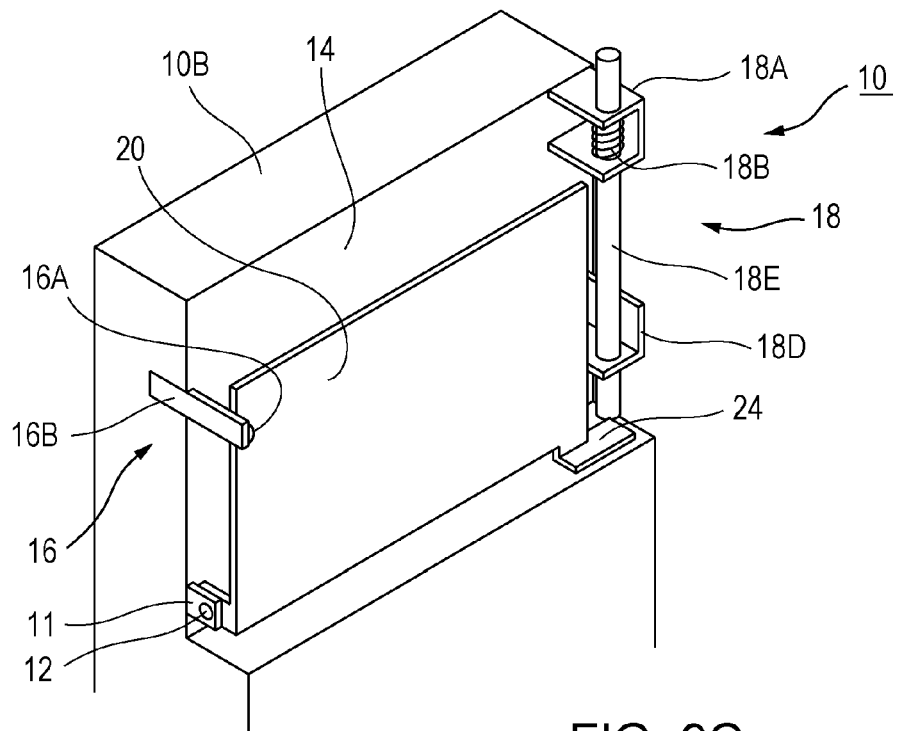
FIG. 9A is a partially enlarged perspective view of a shielding plate portion of a mount unit of a sixth embodiment.

FIG. 9A is a partially enlarged perspective view of a portion of the shielding plate 20 of the mount unit 10 of a sixth embodiment. The shielding plate 20 of the sixth embodiment is provided with a lever 24 similar to the lever 23 provided to the shielding plate 20 of the fifth embodiment. While the lever 23 has a free end protruding to a space between the mount unit 10 and the adjacent mount unit 10, the lever 24 has a free end inside the recessed part 14. Also, while the lever 23 is mounted on a lateral side of the shielding plate 20, the lever 24 is mounted on a side of the shielding plate 20 on a rotational shaft 12 side. The lever 24 provided to the shielding plate 20 of the sixth embodiment serves as an abutting plate for a rod, which will be described further below.

Also, in the mount unit 10 of the fourth embodiment, the engagement of the shielding plate 20 engaged by the lock plate 16 and held in the recessed part 14 is released by the unlock mechanism 17 positioned at the deepest part of the recessed part 14. By contrast, in the sixth embodiment, an unlock mechanism 18 corresponding to the unlock mechanism 17 of the fourth embodiment is provided on an opposite portion of the recessed part 14 across the lock plate 16.

Figure 9B:
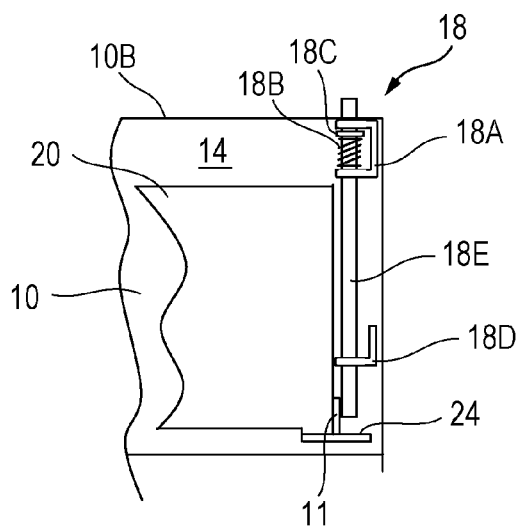
FIG. 9B is a partial side view of the shielding plate portion depicted in FIG. 9A.

As depicted in FIG. 9A and FIG. 9B, the unlock mechanism 18 includes two brackets 18A and 18D protruding outside of a lateral side of the shielding plate 20 in the recessed part 14, a spring 18B, a rod 18E, and a flange part 18C fixed to the rod 18E. The bracket 18A has a section in an inverted C shape, and the bracket 18D has a section in an L shape. The rod 18E penetrates through through holes provided to the brackets 18A and 18D. The flange part 18C is fixedly attached to the rod 18E, and this flange part 18C is positioned inside the bracket 18A, and is pressed by the spring 18B wound around the rod 18E inside the bracket 18A to a rear end face 10B side of the mount unit 10. In this state, the rod 18E has one end protruding from the read end face 10B of the mount unit 10 and the other end positioned near the lever 24 of the shielding plate 20.

Figure 9C:
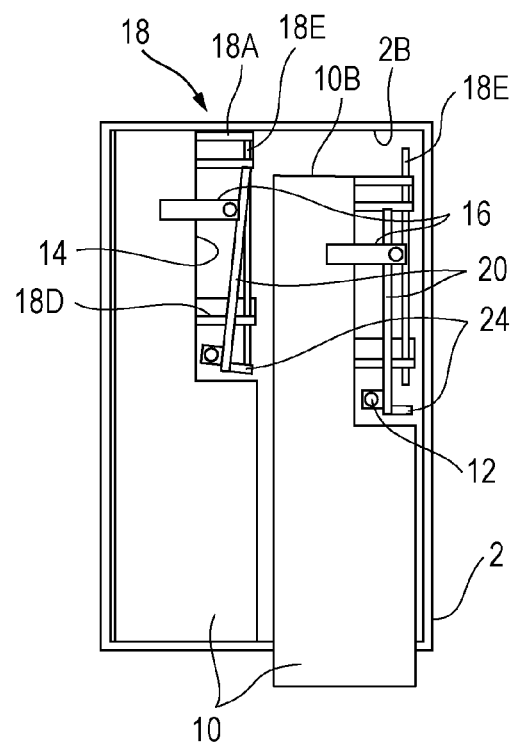
FIG. 9C is a plan view depicting the operation of an unlock mechanism when the mount unit of the sixth embodiment is inserted into the case.

FIG. 9C is a plan view depicting the operation of the unlock mechanism 18 when the mount unit 10 of the sixth embodiment is inserted into the case 2. With the shielding plate 20 being engaged with the lock plate 16, the mount unit 10 is inserted into the case 2. Then, before the rear end face 10B of the mount unit 10 reaches the wall surface 2B positioned at the deepest part of the slot 3, one end of the rod 18E of the unlock mechanism 18 abuts on this wall surface 2B. When the mount unit 10 is further inserted into the case 2, the rod 18E is moved against the spring 18B, and the other end of the rod 18E abuts on the lever 24 to cause the lever 24 to rotate. With the rotation of the lever 24, the shielding plate 20 rotates in an opening direction. When the shielding plate 20 rotates, the engagement of the shielding plate 20 by the lock plate 16 is released.

With the engagement by the lock plate 16 being released, the shielding plate 20 becomes rotatable, and opens up to a position where the tip of the shielding plate 20 abuts on the side surface of the adjacent mount unit 10. As a result, when the adjacent mount unit 10 is extracted from the electronic device 1, the shielding plate 20 automatically opens, and a vacant slot after extraction of the mount unit 10 may be closed.

In the third to sixth embodiments described above, the shielding plate may be engaged in the recessed part by the lock plate provided in the recessed part. Also, when the mount unit is mounted on a mount space, engagement of the shielding plate by the lock plate is released. In the mount unit of any of these embodiments, when the mount unit is extracted for some reason from the slot, the shielding plate is kept in an opening state, and therefore the shielding plate has to be pressed by hand to be engaged by the lock plate when the shielding plate is returned to the mount space. If a user forgets an operation of pressing the shielding plate for engagement by the lock plate when the mount unit is returned to the mount space, the shielding plate abuts on the front surface of another mount unit and may be broken. To address this, an embodiment is described below in which the shielding plate may be closed when the mount unit is extracted from the slot.

Figure 10A:
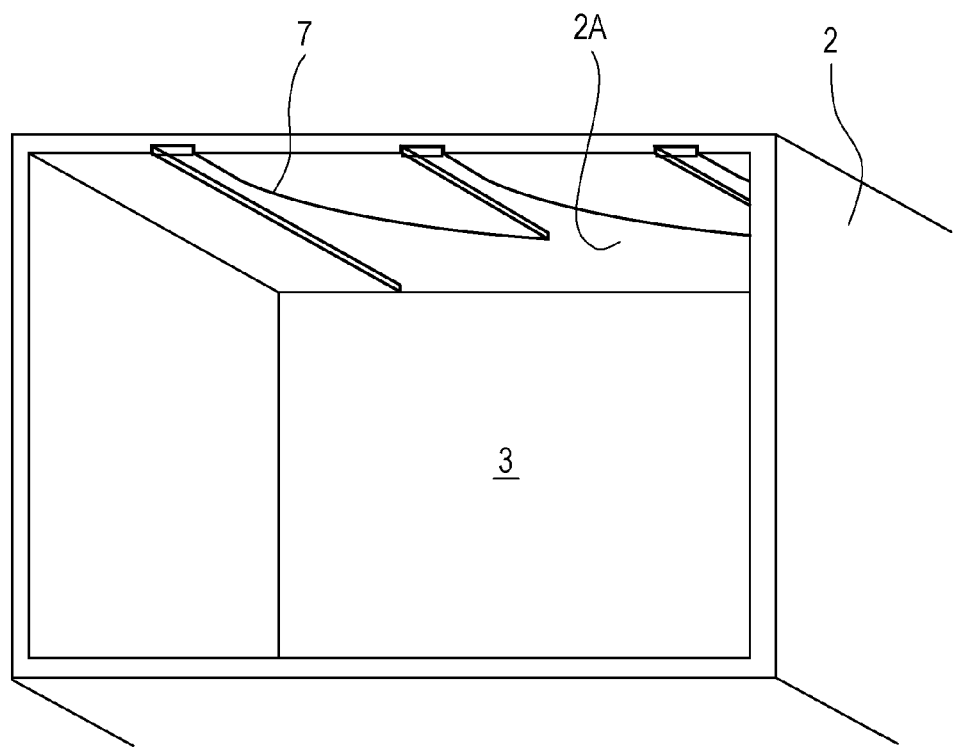
FIG. 10A and FIG. 10B are views for describing a lock mechanism in a mount unit in which a lock plate may engage a shielding plate in a recessed part, the lock mechanism closing and engaging the shielding plate in the lock plate when the mount unit is extracted with the shielding plate being open, FIG. 10A being a perspective view of a mount space of a case of an electronic device, and FIG. 10B being a plan view of the case when one of the mount units accommodated in the case depicted in FIG. 10A is extracted.

FIG. 10A, FIG. 10B, FIG. 11A, and FIG. 11B describe a lock mechanism of the shielding plate 20 and its operation when the mount unit 10 is extracted, the mount unit 10 capable of engaging the shielding plate 20 by the lock plate 16 in the recessed part 14 of the mount unit 10. FIG. 10A is a perspective view of the slot 3 of the case 2 of the electronic device seen from the bottom, depicting the structure of a ceiling wall 2A of the case 2 of an embodiment. In the ceiling wall 2A of the case 2 of this embodiment, curved guide grooves 7 are provided.

Figure 10B:
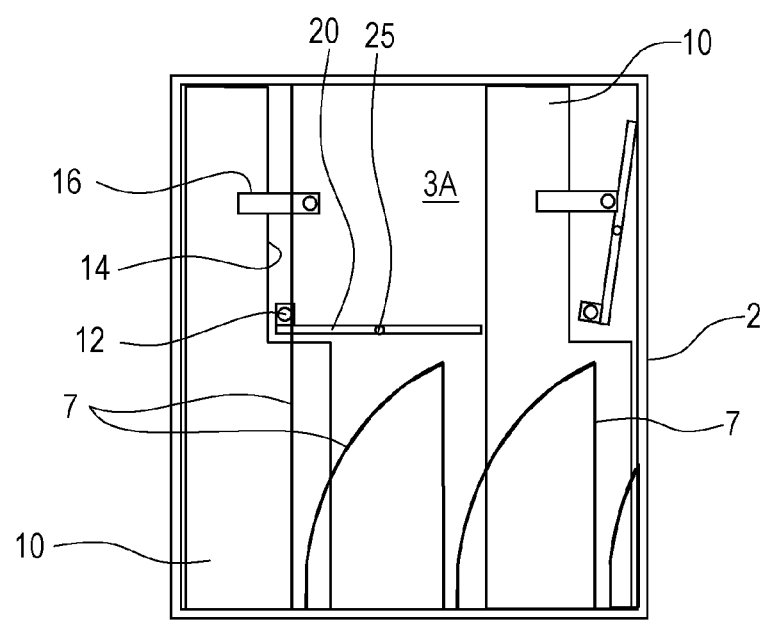

FIG. 10B depicts the state in which two mount units 10 are mounted, with a vacant middle slot therebetween, on the slot 3 of the case 2 where three mount units are mountable depicted in FIG. 10A. Each of the mount units 10 depicted in FIG. 10B is a modification example of the mount unit 10 of the third embodiment. The mount unit 10 of the modification example of the third embodiment is different from the mount unit 10 of the third embodiment in that a post 25 is provided in a protruding manner on a side of the shielding plate 20 facing the ceiling wall 2A of the case 2. This post 25 has a height so as to be engaged in the guide groove 7 provided in the ceiling wall 2A of the case 2.

Figure 11A:
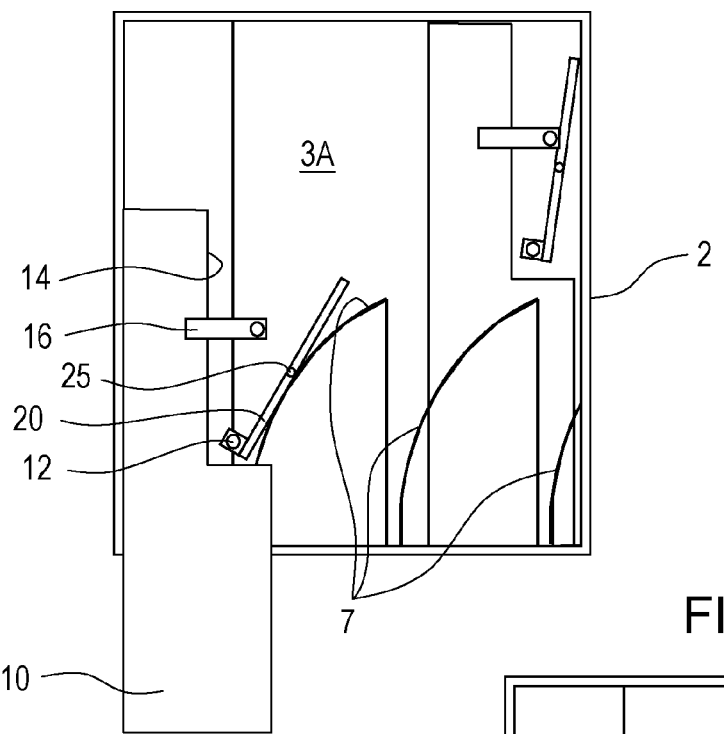
FIG. 11A and FIG. 11B are plan views depicting the course in which an opened shielding plate is locked by the lock plate to be engaged in the recessed part when the mount unit is extracted from the case depicted in FIG. 10B.
Figure 11B:
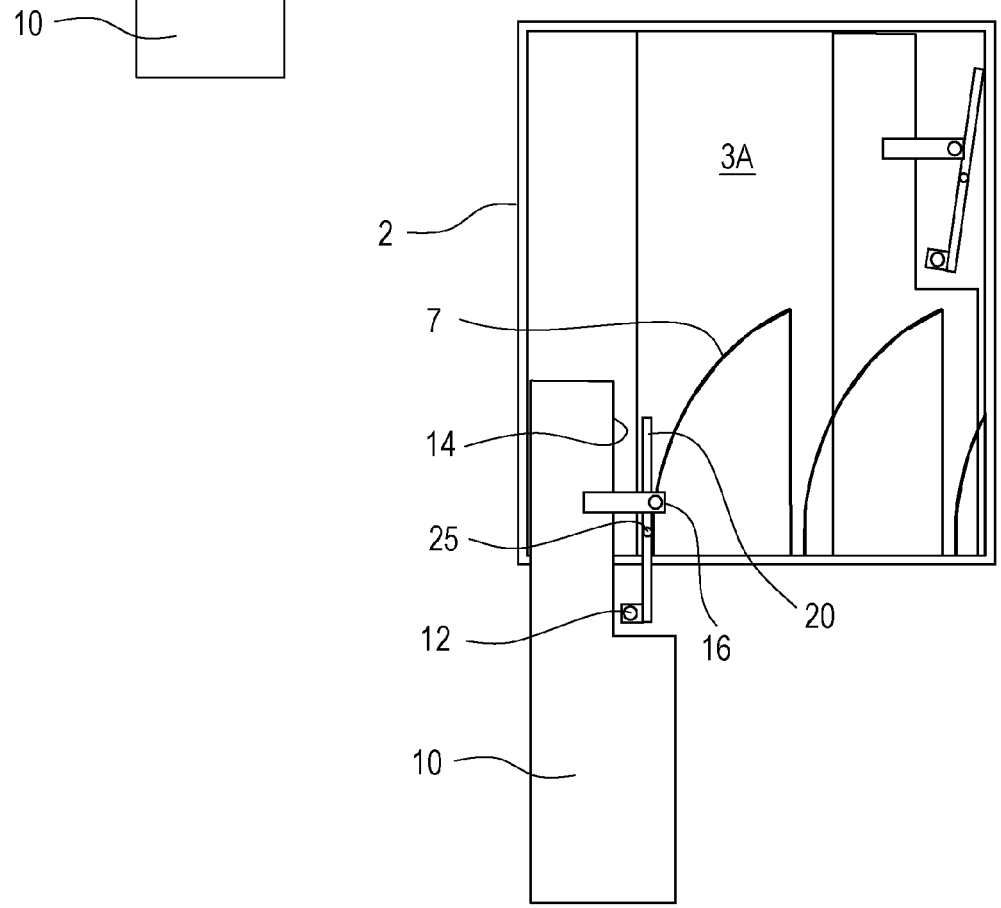

FIG. 11A depicts the state in which the left mount unit 10 is extracted from the case 2 depicted in FIG. 10B. When the mount unit 10 is being extracted, the post 25 provided in a protruding manner on the side of the shielding plate 20 facing the ceiling wall 2A of the case 2 abuts on the guide groove 7, and the shielding plate 20 moves along the guide groove 7 in accordance with the extraction of the mount unit 10. The guide groove 7 has a curved shape so that the abutting post 25 is brought closer to the mount unit 10. Then, when the mount unit 10 is further extracted from the case 2, as depicted in FIG. 11B, at the time when the post 25 is close to the entrance of the case 2, the shielding plate 20 pressed onto the guide groove 7 via the post 25 is engaged by the lock plate 16 in the recessed part 14. As a result, the mount unit 10 extracted from the case 2 is engaged with the lock plate 16 inside the recessed part 14 to be in the state of being held in the recessed part 14 anytime.

The case 2 including the guide grooves 7 depicted in FIG. 10A may be used for the mount unit 10 of any of the fourth to sixth embodiments described above. That is, if the shielding plate 20 of the mount unit 10 of any of the fourth to sixth embodiments is provided with the post 25 similar to that described above in a protruding manner and the mount unit 10 is mounted on the case 2 including the guide grooves 7, as with the third embodiment, the shielding plate 20 is in the state of being held in the recessed part 14 anytime when the mount unit 10 is extracted from the case 2.

Note that as for the mount unit 10 and the guide plate 6 of the fifth embodiment, a seventh embodiment may be applied, in which the shielding plate 20 is engaged by the lock plate 16 in the recessed part 14 anytime when the mount unit 10 is extracted from the case 2. This embodiment is described by using FIG. 12A to FIG. 12C.

Figure 12A:
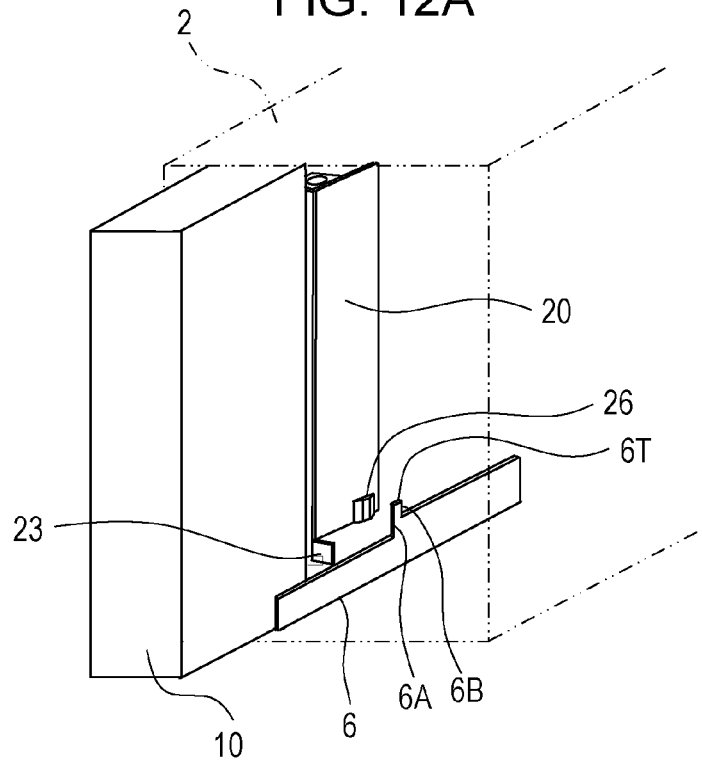
FIG. 12A is a partial perspective view of a mount unit of a seventh embodiment and the structure of a case accommodating the mount unit of the seventh embodiment.

In the mount unit 10 of the fifth embodiment, as described with reference to FIG. 8A to FIG. 8C, the lever 23 is formed at the end of the shielding plate 20 on the rotational shaft 12 side, and the guide plate 6 is provided in the space SP between the mount units 10 aligned. By contrast, the mount unit 10 of the seventh embodiment has a projection 26, with the slope on both sides of the direction of inserting and extracting the mount unit 10 into and from the case 2, at a position on the shielding plate 20 adjacent so as not to overlap the lever 23 with respect to the direction of inserting and extracting the mount unit 10 into and from the case 2, as depicted in FIG. 12A. Also, a protruding part 6T is formed on a portion connecting to the step part 6A of the guide plate 6. The protruding part 6T has a height from the step part 6A corresponding to a height at which engagement with the projection 26 is established at the time of insertion and extraction of the mount unit 10. Also, the position of the a second step part 6B on a side opposite to the step part 6A of the protruding part 6T will be described further below. For simplification of description, it is assumed that the case 2 depicted in FIG. 12A has a size capable of accommodating two mount units 10.

Figure 12B:
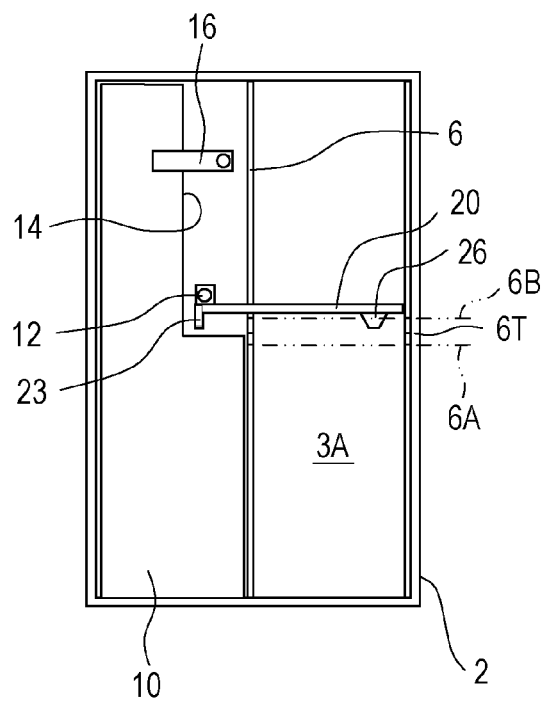
FIG. 12B is a plan view of the case when the shielding plate of the mount unit of the seventh embodiment is an operating state.

FIG. 12B depicts the state in which the mount unit 10 of the seventh embodiment is mounted on the left side of the case 2 depicted in FIG. 12A and another mount unit is extracted on the right side and a slot 3A is present. In this state, the shielding plate 20 rotates to protrude into the slot 3A. The position of the second step part 6B on a side opposite to the step part 6A of the protruding part 6T is on an entrance side of the case 2 from the shielding plate 20 protruding into the slot 3A. The position of the step part 6A is indicated by a two-dot chain line 6A, and the position of the second step part 6B is indicated by a two-dot chain line 6B. Therefore, the protruding part 6T is provided to a portion between the two-dot chain line 6A and the two-dot chain line 6B.

Figure 12C:
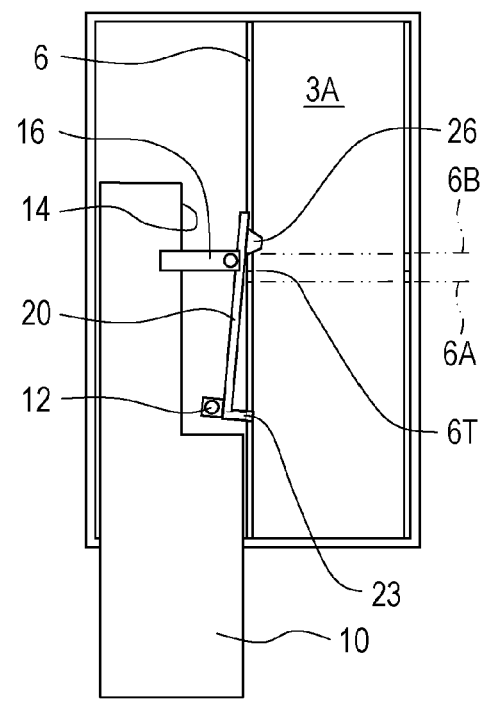
FIG. 12C is a plan view depicting the operation of a lock mechanism when the mount unit of the seventh embodiment depicted in FIG. 12B is extracted from the case.

When the mount unit 10 is extracted from the state depicted in FIG. 12B, the second step part 6B of the protruding part 6T abuts on the shielding plate 20, and therefore the shielding plate 20 rotates about the rotational shaft 12 to a recessed part 14 side. Then, as depicted in FIG. 12C, the projection 26 provided on the shielding plate 20 abuts on the second step part 6B of the protruding part 6T. When the mount unit 10 is further extracted from this state, the slope of the projection 26 is pressed onto the second step part 6B, and therefore the second step part 6B of the protruding part 6T is gradually pressed into the recessed part 14. Then, when the step part 6B reaches a top face of the projection 26, the shielding plate 20 goes over the projection of the lock plate 16 into a recessed part 14 side. As a result, when the engagement of the step part 6B and the projection 26 ends, the shielding plate 20 is engaged with the lock plate 16 and is held in the recessed part 14.

As such, in the mount unit 10 of the seventh embodiment, the protruding part 6T abuts on the projection 26 in the course of extracting the mount unit 10 from the case 2. Therefore, the shielding plate 20 may be moved to the recessed part 14 side and be engaged by the lock plate 16. When the mount unit 10 is mounted on the case 2, the protruding part 6T temporally presses the shielding plate 20 to a recessed part 14 side, and does not contribute to release of the engagement of the shielding plate 20 from the lock plate 16.

Figure 13A:
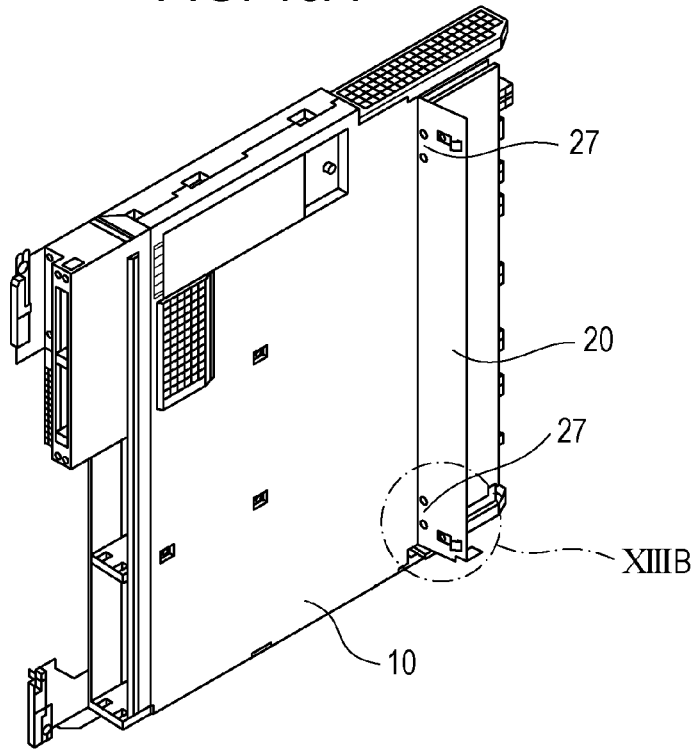
FIG. 13A is a perspective view of a mount unit of an eighth embodiment with a shielding plate being open.
Figure 13B:
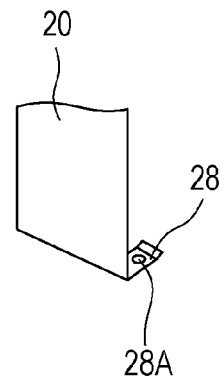
FIG. 13B is a partially enlarged perspective view of a XIIIB portion depicted in FIG. 13A.

FIG. 13A is a perspective view of the mount unit 10 of an eighth embodiment. FIG. 13B is a partially enlarged view of a XIIIB portion depicted in FIG. 13A. The shielding plate 20 is rotatably mounted on the mount unit 10 with hinges 27. FIG. 13A depicts the state in which the shielding plate 20 is in an open state. The shielding plate 20 is provided on a lateral side near a tip with an engaging piece 28 provided with an engagement hole 28A.

Figure 13C:
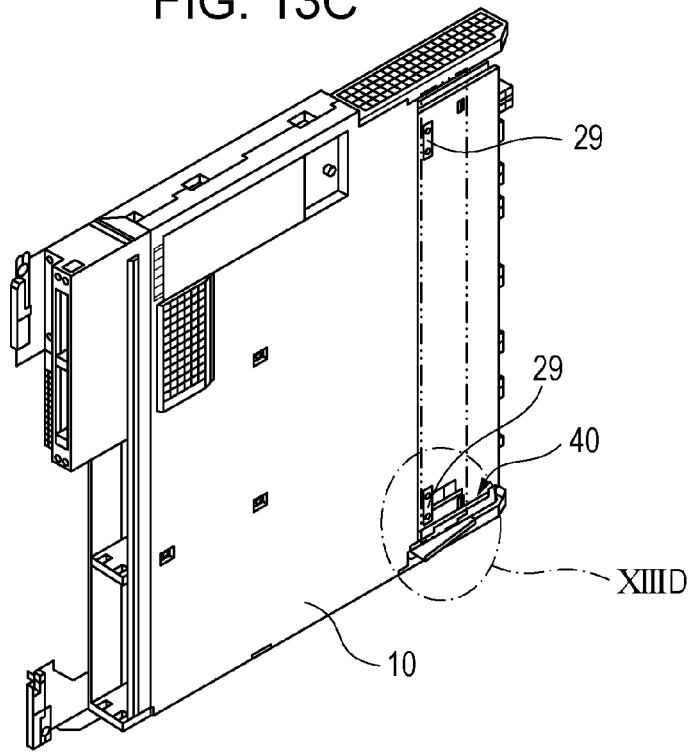
FIG. 13C is a perspective view of the mount unit of the eighth embodiment depicted in FIG. 13A with the shielding plate being closed.
Figure 13D:
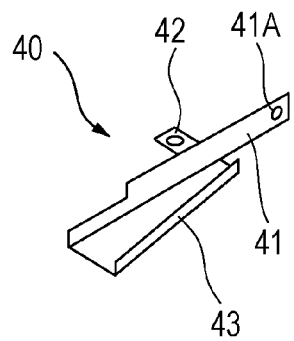
FIG. 13D is a partially enlarged perspective view of a XIIID portion depicted in FIG. 13C.

As depicted in FIG. 13C, a spring 29 is mounted on each hinge 27, pressing the shielding plate 20 in an opening direction. Also, the mount unit 10 is provided with a spring member 40 including a spring part 41, an engagement projection 42, and a slope part 43. A mount hole 41A is provided at an end of the spring part 41 opposite to the slope part 43. The spring member 40 is fixed to the mount unit 10 with a screw or a rivet being inserted into this mount hole 41A, and has the other end capable of rocking. The slope part 43 of the spring member 40 protrudes from the outer shape of the mount unit 10. Furthermore, as depicted in FIG. 14B, the engagement projection 42 of the spring member 40 fits in the engagement hole 28A of the engaging piece 28.

Figure 14A:
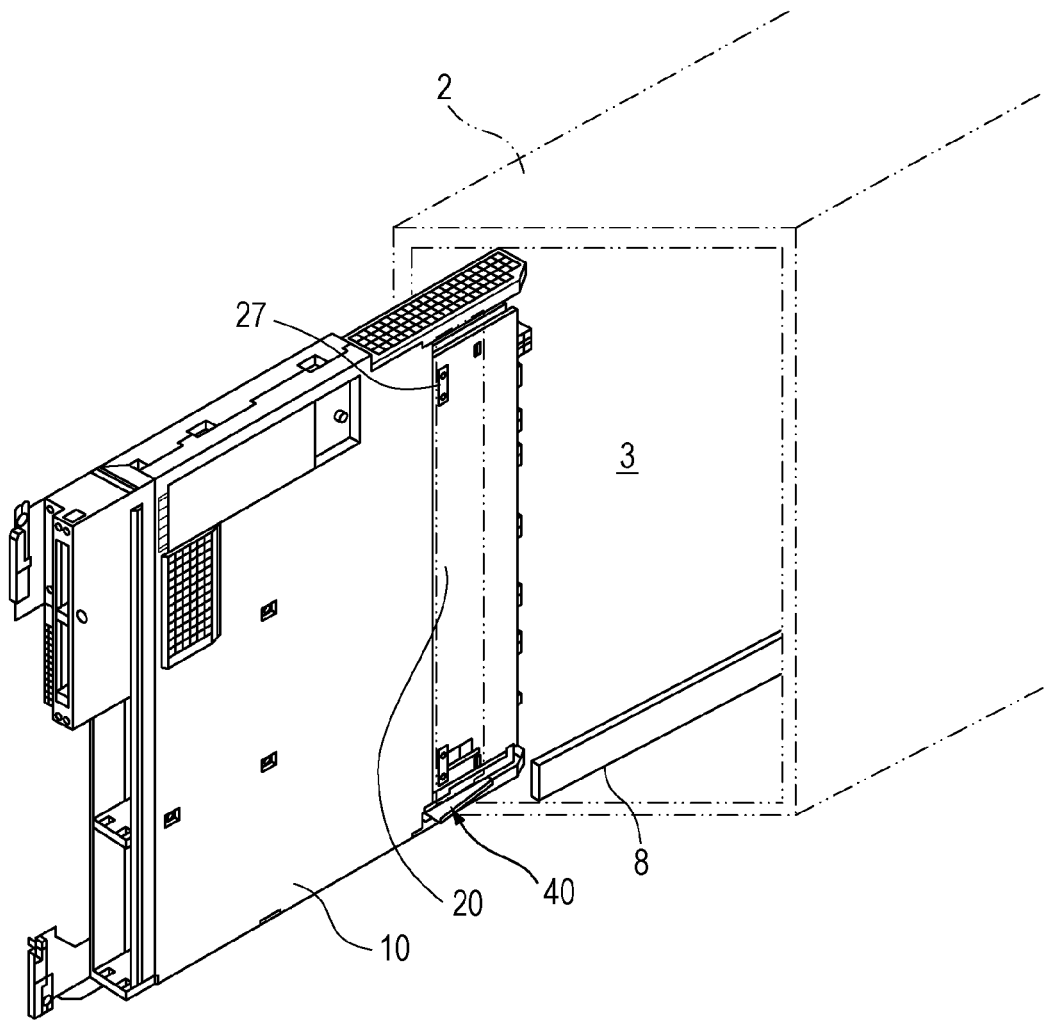
FIG. 14A is a perspective view depicting the state in which the mount unit of the eighth embodiment depicted in FIG. 13A to FIG. 13D is inserted into a case.
Figure 14B:
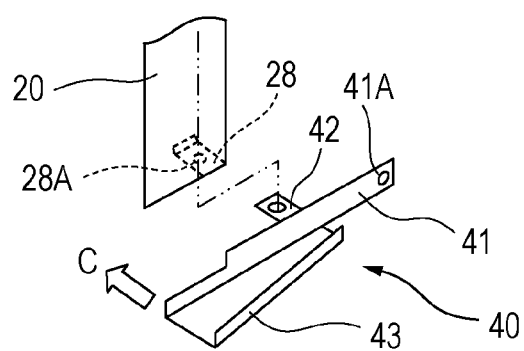
FIG. 14B is a partially enlarged perspective view of main parts of FIG. 14A for assembly.

FIG. 14A is a view depicting the state in which the mount unit 10 of the embodiment depicted in FIG. 13A to FIG. 13D is inserted into the case 2. When the mount unit 10 is inserted into the slot 3 of the case 2, the slope part 43 of the spring member 40 abuts on a guide plate 8 of the case 2, and the spring member 40 is pressed in a direction indicated by an arrow C. With this, the fitting of the engagement projection 42 of the spring member 40 in the engagement hole 28A of the engaging piece 28 is released, and the shielding plate 20 becomes rotatable.

Thus, the operator may mount and remove the mount unit 10 on and from the electronic device 1 without concern for the shielding plate 20. Since the shielding plate 20 is effective in a mount state, the cooling conditions may be unchanged irrespective of whether the mount unit 10 is mounted on the electronic device 1.

The particularly preferred embodiments have been described in detail above.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic device comprising:
    a plurality of slots where a plurality of electronic instruments are mountable, and
    an electronic instrument inserted in any of the plurality of slots, the electronic instrument including:
        a shielding plate that protrudes into an adjacent slot where no electronic instrument is mounted and limits a flow rate of cooling air flowing through the adjacent slot, and
        a movable part to cause the shielding plate to retract into a space between the electronic instruments when the electronic instrument is inserted into the adjacent slot and cause the shielding plate to protrude into the adjacent slot when the electronic instrument in the adjacent slot is extracted.

2. The electronic device according to claim 1, wherein the electronic instrument includes a step on an external wall surface facing the adjacent slot and, when an electronic instrument is inserted into the adjacent slot, the shielding plate retracts into a space between the step and the adjacent electronic instrument.

3. The electronic device according to claim 1, wherein:
    shielding plates of adjacent electronic instruments on both sides of a slot where no electronic instrument is inserted, protrude to interrupt a flow of cooling air in the slot.

4. The electronic device according to claim 1, wherein:
    when the shielding plate and the movable part are placed on one side surface of the electronic instrument, another shielding plate and another movable part are provided on an end face of a slot of slots positioned at both ends of the plurality of slots, the slot positioned on another surface side of the electronic instrument.

5. The electronic device according to claim 2, wherein when an engaging member to engage the shielding plate in the step is provided in the step and the electronic instrument is inserted into the slot with the shielding plate being engaged in the engaging member,
    an engagement releasing member is provided in the slot, the engagement releasing member to release engagement of the shielding plate by the engaging member when the electronic instrument is completely inserted into the slot.

6. The electronic device according to claim 5, wherein the engagement releasing member is provided, correspondingly to the engaging member, on a wall surface of the slot facing an end face of insertion of the electronic instrument into the slot.

7. The electronic device according to claim 5, wherein the engagement releasing member is provided in a space between the electronic instruments in the slots, and engages with a lever provided to the shielding plate during insertion of the electronic instrument into the slot so as to protrude therefrom to cause the shielding plate to protrude into the adjacent slot.

8. The electronic device according to claim 2, wherein when an engaging member to engage the shielding plate in the step and an engagement releasing member to release an engaging operation of the engaging member are provided in the step and the electronic instrument is inserted into the slot, with the shielding plate being engaged with the engaging member,
    the engagement releasing member is engaged with a lever provided to the shielding plate to protrude therefrom to cause the shielding plate to protrude into the adjacent slot when the electronic instrument is completely inserted into the slot.

9. The electronic device according to claim 5, wherein:
a projection is provided on a side of the shielding plate facing a slot ceiling part, and
the slot ceiling part is provided with a guide groove to be engaged with the projection when the electronic instrument is extracted from the slot to move and engage the shielding plate with the engaging member.

10. The electronic device according to claim 5, wherein:
a projection is provided on a surface of the shielding plate facing the engagement releasing member, the projection being engaged with the engagement releasing member prior to the lever when the electronic instrument is inserted into the slot and being engaged with the engagement releasing member subsequently to the lever when the electronic instrument is extracted from the slot, and
the projection is engaged with the engagement releasing member when the electronic instrument is extracted from the slot to engage the shielding plate with the engaging member.

11. The electronic device according to claim 1, wherein
the shielding plate is mounted on the movable part, and the movable part includes a rotational shaft provided in a direction perpendicular to a direction in which the electronic instrument is inserted into and extracted from the slot and a pressing member to press the shielding plate in a projecting direction.

12. An electronic instrument to be mounted on a slot of an electronic device where a plurality of electronic instruments are mountable, the electronic instrument comprising:
a shielding plate provided at a position facing an adjacent slot, protruding into the slot when no electronic instrument is inserted in the adjacent slot, and to interrupt a flow of cooling air in the slot, and
a movable part to cause the shielding plate to retract into a space between the electronic instruments when the electronic instrument is inserted into the adjacent slot and cause the shielding plate to protrude when the electronic instrument in the adjacent slot is extracted.

13. The electronic instrument according to claim 12, wherein
the electronic instrument includes a step on an external wall surface facing the adjacent slot and, when an electronic instrument is inserted into the adjacent slot, the shielding plate retracts into a space between the step and the adjacent electronic instrument.

14. The electronic instrument according to claim 12, wherein
the shielding plate is placed on one side surface of the electronic instrument.

15. The electronic instrument according to claim 12, wherein
the shielding plate is placed on both side surfaces of the electronic instrument.

16. The electronic instrument according to claim 15, wherein
the shielding plate on both side surfaces of the electronic instrument are placed a predetermined distance away from each other with respect to a direction in which the electronic instrument is inserted into and extracted from the slot.

17. The electronic instrument according to claim 13, wherein
when an engaging member to engage the shielding plate in the step and an engagement releasing member to release an engaging operation of the engaging member are provided in the step and the electronic instrument is inserted into the slot, with the shielding plate being engaged with the engaging member,
the engagement releasing member is engaged with a lever provided to the shielding plate to protrude therefrom to cause the shielding plate to protrude into the adjacent slot when the electronic instrument is completely inserted into the slot.

18. The electronic instrument according to claim 12, wherein
the shielding plate is mounted on the movable part, and the movable part includes a rotational shaft provided in a direction perpendicular to a direction in which the electronic instrument is inserted into and extracted from the slot and a pressing member to press the shielding plate in a projecting direction.

* * * * *